United States Patent [19]

Masaru

[11] Patent Number: 4,881,952
[45] Date of Patent: Nov. 21, 1989

[54] METHOD AND APPARATUS FOR DISPOSING DUST PRODUCED DURING AMORPHOUS SILICON FILM-FORMING PROCESS

[75] Inventor: Yasui Masaru, Yokohama, Japan

[73] Assignee: Stanley Electric Co., Ltd., Japan

[21] Appl. No.: 249,280

[22] Filed: Sep. 22, 1988

Related U.S. Application Data

[60] Continuation of Ser. No. 897,157, Oct. 23, 1986, abandoned, which is a division of Ser. No. 733,948, May 14, 1985, Pat. No. 4,642,208.

[30] Foreign Application Priority Data

May 16, 1984 [JP] Japan .................................. 59-96653

[51] Int. Cl.$^4$ ............................................. B01D 3/00
[52] U.S. Cl. .............................................. 55/1; 55/85; 55/96; 55/315; 55/429; 55/233; 98/115.2; 118/326
[58] Field of Search ...................... 55/85, 96, 97, 233, 55/315, 429, 467, 294, 385.1, 385.5, DIG. 25, DIG. 46, 1; 98/115.2; 118/326; 425/215; 134/10, 11

[56] References Cited

U.S. PATENT DOCUMENTS

| | | | |
|---|---|---|---|
| 3,183,647 | 5/1965 | Lang | 55/302 X |
| 3,555,785 | 1/1971 | Wooldridge et al. | 55/294 X |
| 3,920,425 | 11/1975 | Grantham | 55/429 X |
| 4,378,728 | 4/1983 | Berkmann | 98/115.2 |
| 4,406,330 | 9/1983 | Jysky | 55/315 X |
| 4,494,967 | 1/1985 | Barth | 55/228 X |
| 4,506,625 | 3/1985 | Vohringer | 55/DIG. 46 X |
| 4,541,846 | 9/1985 | Sjodin | 55/97 |

Primary Examiner—Charles Hart
Attorney, Agent, or Firm—Spensley Horn Jubas & Lubitz

[57] ABSTRACT

A method and an apparatus of disposing dust produced during a process for forming an amorphous silicon film, which method and apparatus, for the purpose of safely and quickly collecting the dust and of making it possible to form the collected dust to a solidified mass or pellet form to facilitate subsequent handling thereof, comprises: dust-capturing means for collecting the dust adhering to either the entire or partial portions of the film-forming unit without causing scattering of the dust to the outside of the apparatus; a dust hopper capable of receiving, through a pipeline, the dust collected by the dust-capturing means; a bucket filled with a trifloro-trichloro-ethane liquid to render to a slurry-form the dust supplied thereinto an appropriate rate from the dust hopper; and a heat-distilling means to distill the triflorotrichloro-ethane liquid by heating the bucket to retain therein solidified mass or pellets of dust.

11 Claims, 2 Drawing Sheets

METHOD AND APPARATUS FOR DISPOSING DUST PRODUCED DURING AMORPHOUS SILICON FILM-FORMING PROCESS

This is a continuation of copending application Ser. No. 06/897,157 filed on Oct. 23, 1986 now abandoned, which was a divisional of application Ser. No. 06/733,948 filed May 14, 1985, now U.S. Pat. No. 4,642,208.

BACKGROUND OF THE INVENTION (a) Field of the Invention

The present invention relates to a method and an apparatus for disposing dust produced during the process of forming an amorphous silicon (a-Si) film, and more particularly it pertains to a method and an apparatus for disposing a large amount of dust which is produced during the formation of an a-Si film by relying on photo-CVD (Chemical Vapor Deposition) technique or plasma CVD technique.

(b) Description of the Prior Art

Since the discovery of utility of a-Si which is obtained by decomposition of silane gas by a glow discharge, there have been extensively conducted research and development in the matter of applications of and putting into practice of a-Si, and as a result a marked progress is noted at present in the improvement of products using a-Si as a constituent substance. When viewed from the standpoint of production of a-Si, however, there are not a few important problems left to be solved.

One of them concerns improvement of the deposition rate of a-Si during its production. This problem, however, has been solved already as stated in, for example, Japanese Patent Preliminary Publication Nos. Sho 59-193265 and 59-193266 of the same inventors as for the present application.

The second problem concerns the handling or disposal of the large amount of dust which is produced during the formation of a-Si films by glow discharge of silane gas. Since, in the past, a-Si itself was still in its way for development, it has been the general idea that the formation of a-Si films has been conducted only on the experimental basis in laboratories, and thus the manufacture of a-Si on a commercial mass production basis at a manufacturing plant has been very limited, if any. In the past, the disposal of dust which was produced in each experiment relied on an unsophisticated manner such that the dust was subjected to suction by using a small-sized vacuum cleaner or like means and the collected dust was discarded directly. When it is intended to make a mass-production of a-Si photoreceptors, however, the disposal of the dust becomes a very important task.

The reason therefor is due to the special physical property of silicon dust. Unless an efficient and effective method for the disposal of this dust is established, the production of a-Si will not become possible to be done on an industrial basis. As a preliminary measure for dealing with the large amount of silicon dust which entails the manufacture of a-Si, the present inventors have already solved the problem concerning a-Si film formation itself. The most important matter, however, can be boiled down to only one thing which is how the dust thus produced should be disposed. The very specific property of this dust is as follows.

(A) The dust consists of a light-weight, very fine particles of powder form which is unsteady and is ready to fly and scatter around immediately when contacted by a slight current of air, and will contaminate the environment, and thus it gives rise to a problem in the sanitary management for the workers involved in the manufacture.

(B) a-Si dust is ignited quite easily by a small source of fire such as flame of a match, lighted cigarette, sparkling, or spark from a driven rivet. The produced dust in itself has no spontaneous ignitability. Once ignited from a near by flame, however, the dust will combust furiously like fireworks, and the burning dust will easily scatter and fly around, so that this flame of buring dust will easily induce a fire on surrounding things. In case a large amount of dust is present, it will instantaneously catch fire and the flame will spread extensively throughout the area like an explosive or a firework, and accordingly the dust is very dangerous.

(C) Once ignited, the burning dust cannot be extinguished according to the present technique unless the surrounding air is completely shut off.

(D) a-Si dust has no affinity to water and the particles of dust do not disperse in water, but they remain always in the state of floating on the surface of water, and thus it is not possible to deal with the dust by using water.

(E) Accordingly, the dust, once ignited, will not become extinguished by merely sprinking water thereonto, but it will continue to burn in the state of floating on the surface of water. Also, in the presence of water, the dust will rather vigorously burn while developing a scorching heat. Thus, the burning dust would bring about the same phenomenon as if by sprinking oil onto fire if water is sprinkled onto the site of combustion of a large amount of dust.

(F) Although the dust has no affinity to water, it has affinity to organic solvents in general, and it disperses in these solvents of liquid form. However, the dust reacts with lower alcohol and produces hydrocarbon gas, silane gas and hydrogen gas, and such a gas could ignite spontaneously. Thus, the dust is dangerous, and one must avoid mixing the dust with an inflammable organic solvent.

(G) a-Si dust has a smooth flowability like a liquid. Even when dust is applied with a pressure externally, the dust will only displace around, and it is quite difficult to subject the dust to a compression pressing.

(H) Though depending on a-Si film-forming conditions employed, the dust presents a brown color in general. When the dust is combusted, the burnt dust will still remain as a powder of whitish brown color. This remnant is intensively hydrophilic, and disperses well in water, but will remain as sediments at the bottom of water when left over. The sediments are silicon oxide, which is of a same quality as soil.

As stated above, a-Si dust in its fine powder form is extremely dangerous, and is very difficult to handle. As such, the dust which is produced inevitably during mass production in an a-Si manufacturing plant will not lead to the solution of problems merely by collecting the dust which is produced. In the event that the handling or disposal of dust is not done in an appropriate way, there will arise not only problems related to environmental pollution but also a danger of destroying the surrounding things.

As will be appreciated from the foregoing statement, in the past the collection per se of dust has really been an extremely dangerous operation, and the prior method of its disposal has been just to directly combust the dust. Thus, it has not been possible to place the combustion under control, and therefore a great danger was involved. Furthermore, after combustion of dust, the remnants remain in the form of another dust or powder. Because of such dangers as mentioned above, it has been the usual technique to introduce and mix the collected dust in an amount of water containing, dissolved therein, a higher alcohol or a surface active agent to render the dust hydrophilic, and thereafter the resulting substances are dispersed in water. In such a case, it takes a considerable length of time until the burnt dust is dispersed in water. Moreover, depending on cases, the dust could develop a chemical reaction and could produce a poisonous gas. What is more, the liquid per se which contains chemical agents is difficult to dispose, and could require a very large used-liquid treating equipment which, in turn, requires a large running cost.

In case it is intended to manufacture, for example, amorphous silicon photosensitive devices, it has been the prior technique of such a low level that silane gas is supplied into the reaction chamber, while applying radio frequency (RF) to the interior of the reaction chamber to develop a glow discharge, thereby effecting deposition of a-Si substance onto the surface of a substrate which is housed therein, and that, during this reaction, the dust which is produced within the reaction chamber is collected merely by a suction means such as a rotary pump (RP), and the collected dust is discarded directly. In the past, there have been attempted various counter-measures for the danger of silane gas. With respect to the dust of silicon among others, however, the development of its counter-measure has been rather neglected so far.

SUMMARY OF THE INVENTION

In view of the foregoing state of art, it is the primary object of the present invention to provide a method and an apparatus of disposing dust which is produced during the process of forming a-Si films, which method and apparatus being such that, in order to safely and quickly collect such dust to facilitate its subsequent handling, the dust can be formed into a solid mass or pellets.

This object is attained according to the present invention by capturing the dust without causing the dust to scatter to the outside of the amorphous silicon film-forming system, and then mixing the collected dust in a heat-distillable non-inflammable liquid having affinity to silicon to thereby render the captured dust to a slurry state, and thereafter heat-distilling the slurry-form dust mixture to recover only the liquid from the mixture substantially completely, and then collecting the resulting solidified mass or pellets of dust for recycling purpose.

According to a preferred formation of the present invention, the dust disposing apparatus comprises a vacuum suction means coupled to a film-forming section for discharging the dust produced within the film-forming section to the outside thereof; a dust capturing section to said vacuum suction means; a dust hopper connected to the dust capturing section for receiving the captured dust therefrom; mixing means removably coupled to the dumping means and filled with a heat-distillable liquid for rendering the dust flowing thereinto from the dumping means to a slurry state; and heat-distilling means connectable to said mixing means for heating the mixing means to distill said liquid so as to leave, within the mixing means, the resulting solidified mass or pellets of dust.

According to the present invention, there preferably can be used trifloro-trichloro-ethane ($C_2Cl_3F_3$) liquid to serve as the above-mentioned heat-distillable liquid.

This and other objects of the present invention will become more apparent during the course of the following detailed description and appended claims.

DETAILED DESCRIPTION OF THE PREFERRED EMBODIMENTS

The present invention will hereunder be made with respect to an embodiment to manufacture a photosensitive drum using amorphous silicon.

Figure 1:
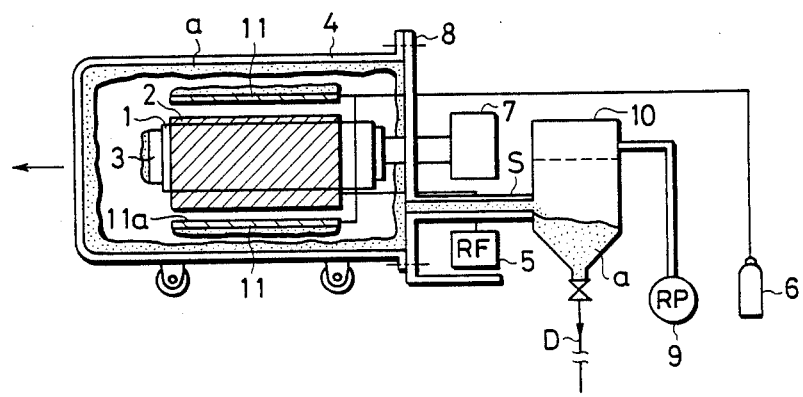
FIG. 1 is a diagrammatic explanatory illustration showing an embodiment of the a-Si film-forming apparatus provided with a dust capturing means according to the present invention.

In FIG. 1, reference numeral 1 represents a substrate drum for forming thereon an a-Si film. In order to realize a film of even thickness, this substrate drum 1 is mounted on a mandrel 3 coupled to a motor 7. Within this mandrel 3, there may be additionally provided a heater for adjusting the temperature within the substrate. Numeral 2 represents a cylindrical metal net-form electrode which is connected to a radio frequency power supply 5 to develop a glow discharge across the electrode and the substrate drum 1. Numeral 4 represents a vacuum reaction chamber provided with castors on the underside thereof, and is arranged to be detachable from a base plate 8. Numeral 6 represents a supply source of a starting material such as silane gas. A doping gas such as $H_2$ and $N_2$ is introduced into the reaction chamber 4 during a glow discharge, through a gas ejection tube 11 having a number of gas ejecting fine perforations formed through its circumference and being connected to the gas supply 6. This gas is supplied while being adjusted of its flow rate via a valve not shown which, in turn, is provided on the gas supply 6 which may be a container filled with pressurized such gas. The glow discharge is developed by an application of a radio frequency power which is supplied across the substrate drum 1 and the electrode 2 from the radio frequency power supply 5. Numeral 9 represents an evacuating means for producing a substantial vacuum, and is constructed to keep a constant operating pressure within the reaction chamber 4, and it is connected to this reaction chamber 4 via a dust collecting vessel 10 having a filtering function.

In the film-forming apparatus having the above-mentioned structure, the starting material gas such as silane is decomposed by the application of a glow discharge thereto, and part of the decomposed gas deposits as an a-Si film on the surface of the drum 1. Also, the solidified substance in the gas atmosphere deposits to the entire surfaces of the inner walls of the reaction chamber 4 and also around the gas ejection tube 11 provided within the reaction chamber, and the remainder passes through the drain tube S to be captured into a dust filtering and collecting vessel 10. After completion of the film-forming operation, these deposits and the captured dust are cleaned to prepare for the next film-forming operation.

Figure 2:
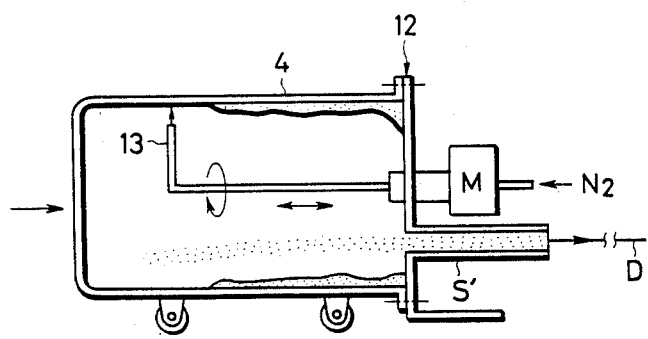
FIG. 2 is a diagrammatic explanatory illustration showing the state that a dust capturing means different from that shown in FIG. 1 is attached to the apparatus and that the interior of the apparatus is being cleaned.

FIG. 2 shows the state in which the reaction chamber 4 is detached from the base plate 8 and is connected to another cleaning means 12 having a cleaning function. A stable inert gas such as $N_2$ is introduced, under pressure, into the reaction chamber 4 through a rotary reciprocable nozzle 13 which is connected to a motor M which, in turn, is provided on the cleaning means 12, to blow away the dust adhering to the surfaces of the inner walls of the reaction chamber so as to be discharged to the outside of the reaction chamber via a suction tube S'.

Figure 3:
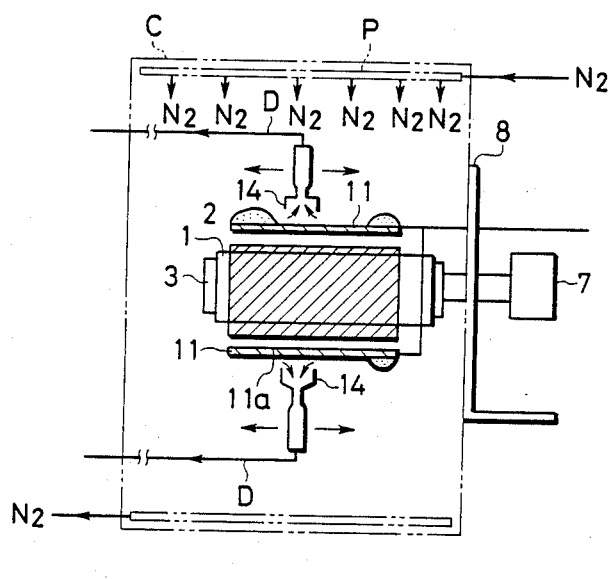
FIG. 3 is a diagrammatic illustration showing the state that the dust deposited on the interior-constituting members of the a-Si film-forming apparatus is being cleaned.

FIG. 3 shows an example wherein a film-forming unit comprising a mandrel 3, a drum 1, a metal net-form electrode 2 and a gas-ejecting tube 11 is exposed into a tightly closed chamber C from a reaction chamber 4 by attaching a base plate 8 to this closed chamber C, and the dust adhering to the electrode 2 and the gas-ejecting tube 11 is perfectly removed while sliding respective suction nozzles 14 sideways along the net. Arrangement is provided so that a stable inert gas current such as $N_2$ is introduced into this closed chamber C from an upper portion thereof to travel toward its bottom via a gas-discharging pipe P so that this introduced gas is discharged through the bottom of this chamber into a capturing vessel via a tube.

It will be needless to say that the respective functions shown in FIGS. 2 and 3 may be incorporated directly into the reaction chamber 4 shown in FIG. 1.

Figure 4:
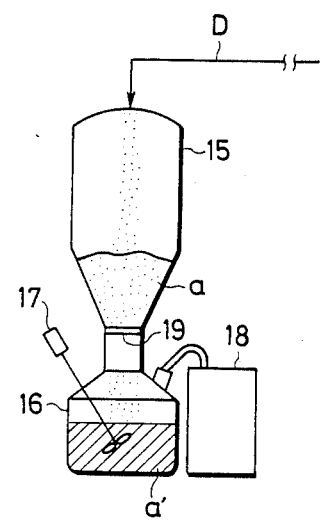
FIG. 4 is a diagrammatic explanatory illustration showing the method of disposing the captured dust.

In FIG. 4, the dust a which has been captured in the filtering and collecting vessel 10 of FIG. 1, or the dust captured in either FIG. 2 or FIG. 3 is therefrom invariably collected into a dust hopper 15 via a dust flow passageway D. Numeral 16 denotes a bucket which is detachably connected to a trifloro-trichloro-ethane liquid supply 18 via an appropriate means 19 such as a dumper, and has been preliminarily filled with a liquid $C_2Cl_3F_3$. Arrangement is provided so that the neck and mouth portion of this bucket 16 communicates the bottom of the dust hopper 15 so that the dust collected within the hopper will be allowed to drop and flow into this bucket 16 by its own weight. Numeral 17 represents a stirring means which can be driven from outside the system by an appropriate driving power, and is assigned to mix the dust with the $C_2Cl_3F_3$ liquid in the bucket 16 to render them to a slurry-form of dust a'.

Figure 5:
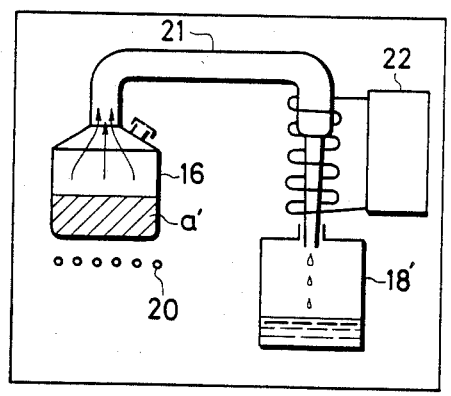
FIG. 5 is a diagrammatic explanatory illustration showing an example of means for recovering the $c_2Cl_3F_3$ liquid for rendering the dust to solidified mass or pellets.
Figure 6:
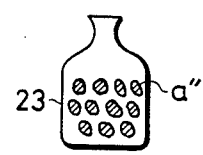
FIG. 6 is a diagrammatic explanatory illustration showing an example of the state that pellets of dust are contained in a container.

FIG. 5 shows $C_2Cl_3F_3$ liquid recovering means. The bucket 16 which contains the slurry-form of dust which has been mixed with the liquid is detached from the hopper 15, and then it is heated to an appropriate temperature of 80° C. or lower by an appropriate heating means 20 to cause evaporation of only $C_2Cl_3F_3$, and the vapor of this substance is then cooled by a cooling means 22 via a distilling tube 21 so as to be received into a $C_2Cl_3F_3$ recovering vessel 18' as a liquid $C_2Cl_3F_3$. The above-mentioned slurry-form dust a' will, when $C_2Cl_3F_3$ completely evaporates as it is heated, become solidified pellets a" as shown in FIG. 6. These pellets are put into an appropriate container such as a bag 23 and are burnt. The dust thus burnt differs in no way from ordinary soil, and accordingly it can be discarded with no difficulty. Also, this burnt dust is a hydrogenized amorphous silicon containing a large amount of hydrogen. Therefore, the solidified pellets of dust mentioned above may be subjected further to a shaping or pressing step so that the resulting mass not only may be preserved as it is, but also it may be utilized again as a hydrogenized silicon semiconductor material. Especially, as stated of the present invention, the burnt dust can be solidified in the state of not containing any impurity since its contact with external atmosphere has been avoided. Thus, the above-mentioned silicon containing a large amount of hydrogen may be subjected to decomposition of water which it contains to thereby develop hydrogen therefrom. The hydrogenized silicon in its powder form is difficult to utilize in an effective way. When solidified hydrogenized silicon is applied with light rays or with electric stimulation in water to activate it, the resulting activated solid matter will develop $H_2$ gas very efficiently. Thus, the burnt dust is quite useful also from the aspect of utilizing hydrogen energy.

The foregoing statement may be summarized as follows.

(1) The dust produced during the a-Si film-forming process is collected in a dust collecting vessel 16 without being exposed to the outside of the system. Accordingly, there does not arise any scattering of dust to the outside of the system, so that there occurs no problem of dust pollution nor a problem concerning sanitation for the workers involved. Also, dust is carried through a safety pipe line D and has no contact with the outside of the system, so that there is no risk of being ignited and combusted. Furthermore, the blowing of gas into the reaction chamber 4 is performed by using an inert gas such as nitrogen gas, so that there is eliminated any fear for combustion of dust, and a greater safety is insured. Moreover, the electric system which is associated with the manufacturing system is of an explosion-free structure for the sake of safety.

(2) Dust is collected in the dust hopper 15 by relying on the powder transportation technique. The interior of the whole system is preliminarily filled with an inert gas such as nitrogen so that the respective members are surrounded by the inert gas. When a certain amount of dust a has accumulated in the dust hopper 15, the dumper 19 is opened to allow the dust a to drop and flow into the $C_2Cl_3F_3$-containing vessel 16. Thus, the dangerous dust will not scatter either entirely or partially to the outside of the system, and accordingly safety is insured.

(3) Dust has a good affinity to $C_2Cl_3F_3$ liquid, and will become slurry-form when mixed therewith. The $C_2Cl_3F_3$ liquid never reacts with dust a. Also, the $C_2Cl_3F_3$ liquid itself is not inflammable, and will not combust spontaneously. The said slurry-form dust is hard to get ignited. Once ignited, however, the mass of dust slurry will combust and ejects poisonous halogen gas, and so caution must be taken to the heat of fire which may be present in the vicinity of the slurry of dust. Being slurry-form, however, there will not occur scattering of dust as in the case of fine powder form of dust.

(4) It is possible to recover only the $C_2Cl_3F_3$ liquid by using a $C_2Cl_3F_3$ recovering means. The recovered $C_2Cl_3F_3$ liquid can be used again in the disposal of dust in the subsequent operation, and therefore repletion of the liquid only in an amount which has been lost is enough, and thus a big economic effect is achieved. The $C_2Cl_3F_3$ per se is not discharged from the system, so that no problem of environmental pollution will arise.

(5) After $C_2Cl_3F_3$ has evaporated completely within the system, there is formed pellets a″ of solidified silicon. Since they are in the form of clods, there is no fear for their scattering around, and accordingly they are easy to handle. Even these pellets of silicon can burn if ignited. However, they will not develop an explosively severe combustion like the untreated dust, but instead, they will burn only gently. Also, as stated above, the pellets will not scatter around as does the dust of fine powder form, and therefore there is no fear for induced ignition, and thus pellets are much safer as compared to silicon in the state of fine powder. Furthermore, after combustion, the pellets will present a state like cinders of burnt coal, and they are easy to discard.

(6) In case the dust has been solidified in such a manner as that described above, the solidified dust has reduced its volume to 1/10–1/20 of its original volume of powder, which is quite advantageous and convenient for a volume for disposal.

Description has been made of an embodiment with respect to the disposal of dust which is produced during the manufacture of a photosensitive drum using amorphous silicon. It should be noted, however, that the present invention is not limited thereto. More particularly, the present invention is applicable equally effectively to the disposal of dust which is produced as a by-product when an a-Si film or a polycrystalline silicon film is formed by decomposing a gaseous silicon compound containing silane by a glow discharge relying on, for example, plasma CVD technique to manufacture a solar battery or other active devices.

What is claimed is:

1. A system for disposing of dust produced during a process of forming an amorphous silicon film by decomposing a starting material gas containing silane gas as its principal component, comprising:
   a unit for collecting the dust including:
      vacuum suction means coupled to a film-forming section to discharge the dust produced within said film-forming section to the outside of this section;
      a dust-capturing section coupled to said vacuum suction means;
      a dust hopper connected to said dust-capturing section to receive the captured dust; and
      dumping means, provided at a bottom portion of said dust hopper, for dumping dust received in the dust hopper, said dumping means being adapted to receive a detachable mixing means; and
   heat-distilling means, adapted to receive a detachable mixing means, for heating said mixing means; and
   mixing means, adapted for detachably coupling to said dumping means and said heat-distilling means and including a heat-distillable liquid therein, for receiving dust from said dumping means when coupled to said dumping means and mixing said dust with said liquid to transform said dust to a slurry-form and for heating and distilling said liquid when coupled to said heating means to convert the slurry-form dust therein into a final disposal product comprising a solidified mass or pellets of dust.

2. An apparatus according to claim 1, in which:
   said liquid is a trifloro-trichloro-ethane liquid.
3. An apparatus according to claim 1, in which:
   said dust hopper is filled with an inert gas.
4. A system for disposing of dust produced during a process of forming within a reaction chamber an amorphous silicon film by decomposing a starting material gas containing silane gas as its principal component, comprising:
   a unit for collecting the dust including:
      cleaning means, detachably coupled to the reaction chamber, for discharging dust adhering to inner surfaces of walls of said reaction chamber to the outside of the reaction chamber;
      a dust hopper connected to said cleaning means to receive the dust discharged from said reaction chamber; and
      dumping means provided at a bottom portion of said dust hopper for dumping dust received in the dust hopper, said dumping means being adapted for coupling a detachable mixing means thereto;
   heat-distilling means, adapted to receive a detachable mixing means containing a heat-distillable liquid, for heating the mixing means to distill said liquid; and
   mixing means, adapted for detachably coupling to said dumping means and said heat-distilling means and including a heat-distillable liquid therein, for mixing dust received from said dumping means to transform said dust to a slurry-form, when coupled to said dumping means with said liquid, and for distilling said liquid and converting the slurry-form dust therein into a final disposal product comprising a solidified mass or pellets of dust, when coupled to said heat-distilling means.

5. An apparatus according to claim 4, in which:
   said cleaning means comprises a motor, and a nozzle coupled to said motor and capable of making rotating and reciprocating movements within said reaction chamber and assigned to introduce an inert gas into the reaction chamber therethrough.
6. An apparatus according to claim 4, in which:
   said liquid is a trifloro-trichloro-ethane liquid.
7. An apparatus according to claim 4, in which:
   said dust hopper is filled with an inert gas.
8. A system for disposing of dust produced during a process of forming an amorphous silicon film by decomposing a starting material gas containing silane gas as its principal component, comprising:
   a unit for collecting the dust including:
      suction nozzle means for sucking the dust, said suction nozzle means being movably provided with a tightly closed chamber to discharge dust adhering to a film-forming unit housed in said closed chamber to the outside of this latter chamber;
      a dust hopper connected to said suction nozzle means to receive the dust discharged from said closed chamber; and
      dumping means provided at a bottom portion of said dust hopper for dumping the received dust, said dumping being adapted for coupling a detachable mixing means thereto;
   heat-distilling means, adapted to receive a detachable mixing means having a heat-distillable liquid therein, for distilling said liquid; and mixing means, adapted for detachably coupling to said dumping means and said heat-distilling means and including a heat-distillable liquid therein, for receiving dust from said dumping means when coupled to said dumping means and mixing said dust with said liquid to transform said dust to a slurry-form and for transforming the slurry-form dust therein into a final disposal product comprising a solidified mass or pellets of dust when coupled to said heat-distilling means.

9. An apparatus according to claim 8, in which:
a current of an inert gas is formed in said closed chamber to travel from its upper portion toward its bottom portion.

10. An apparatus according to claim 8, in which:
said liquid is trifloro-trichloro-ethane liquid.

11. An apparatus according to claim 8, in which:
said dust hopper is filled with an inert gas.

* * * * *